(12) United States Patent
Duan

(10) Patent No.: US 7,249,625 B2
(45) Date of Patent: Jul. 31, 2007

(54) WATER-COOLING HEAT DISSIPATION DEVICE

(75) Inventor: Qiang-Fei Duan, Chung-Ho (TW)

(73) Assignee: Cooler Master Co., Ltd., Taipei (TW)

( * ) Notice: Subject to any disclaimer, the term of this patent is extended or adjusted under 35 U.S.C. 154(b) by 87 days.

(21) Appl. No.: 11/195,785

(22) Filed: Aug. 3, 2005

(65) Prior Publication Data
US 2007/0029069 A1    Feb. 8, 2007

(51) Int. Cl.
*F28D 15/00*  (2006.01)
(52) U.S. Cl. .................. 165/80.4; 165/104.28
(58) Field of Classification Search .............. 165/80.4, 165/80.5, 104.28, 104.31, 104.33
See application file for complete search history.

(56) References Cited

U.S. PATENT DOCUMENTS

| | | | | |
|---|---|---|---|---|
| 5,729,995 A | * | 3/1998 | Tajima | 62/259.2 |
| 6,019,165 A | * | 2/2000 | Batchelder | 165/80.3 |
| 6,580,610 B2 | * | 6/2003 | Morris et al. | 361/699 |
| 2004/0173342 A1 | * | 9/2004 | Sugito et al. | 165/148 |
| 2004/0240179 A1 | * | 12/2004 | Koga et al. | 361/699 |
| 2006/0144569 A1 | * | 7/2006 | Crocker et al. | 165/104.33 |
| 2006/0157230 A1 | * | 7/2006 | Kawahara et al. | 165/104.33 |
| 2006/0185829 A1 | * | 8/2006 | Duan et al. | 165/104.33 |
| 2006/0191669 A1 | * | 8/2006 | Chen et al. | 165/104.33 |

* cited by examiner

*Primary Examiner*—Teresa J. Walberg

(57) ABSTRACT

A heat dissipation system includes a housing, a circulator and a cooler. The housing has at least one surface made of heat-conductive metal to contact with a heat source. The housing includes a recess with a passage formed on the bottom to contain cooling liquid and an inlet and an outlet connected to the recess. Two pipes are provided to connected between the inlet and the outlet and the cooler, respectively. The circulator is installed in the recess to circulate the flowing of the cooling liquid. As such, heat generated from the heat source is directly conducted to the housing and takes away by the cooling liquid circulated by the circulator to the cooler.

10 Claims, 8 Drawing Sheets

WATER-COOLING HEAT DISSIPATION DEVICE

BACKGROUND OF THE INVENTION

The present invention relates in general to a water-cooling heat dissipation device, and more particularly, to the water-cooling heat dissipation device applied to a heat-generating device such as a central processing unit (CPU).

As the computer is more powerful with high speed CPU, heat dissipation issue is more serious to be concerned as how to keep the CPU at a proper temperature so that the computer can work reliably.

FIG. 1 shows a conventional water-cooling heat dissipation system 100a used for a CPU. As shown, the heat dissipation system 100a includes a heat sink 10a mounted on a CPU 200a, a water pump 20a, a cooler 30a and a water tank 40a. The heat sink 10 has a water outlet 101a and a water inlet 102a. A pipe 103a is connected between the water inlet 102a and a water outlet 201a of the water pump 20a. Another pipe 104a is connected between the water outlet 101a and a water inlet 301a of the cooler 30a. The cooler 30a is composed of multiple fins 303a. A pipe 304a is connected between a water outlet 303a of the cooler 30a and a water inlet 401a of the water tank 40a. Finally, another pipe 402a is connected between a water outlet of the water tank 40a and a water inlet 202a of the water pump 20a. Thus, a circulation of the water-cooling heat dissipation system 100a is built. In application, colder water is fed into the heat sink 10a from the water pump 20a. After heat exchange, the water is heated by CPU 101a into warmer water to flow out of the heat sink 10a. The warmer water which flows into the cooler 30a will be cooled down. Thereby, the colder water then flows back to the water tank 40a to supply the water circulation.

However, this type of water-cooling heat dissipation system 100a includes two many separated components of the heat sink, the water pump, the cooler, the water tank and the pipes. The bulk volume will occupy lots of installation space to impede compact development of the computer.

SUMMARY OF THE INVENTION

The present invention provides a water-cooling heat dissipation device directly using a housing to conduct heat so that a compact structure to reduce cost, weight and volume is obtained.

The present invention further provides a water-cooling heat dissipation capable of fully contained a water circulator therein to provide functions of water storage, water circulation and heat exchange all together.

A heat dissipation system provided by the present invention includes a housing, a circulator and a cooler. The housing has at least one surface made of heat-conductive metal contacted with a heat source. The housing includes a recess with a passage formed on the bottom to contain cooling liquid and an inlet and an outlet connected to the recess. Two pipes are provided to connected between the inlet and the outlet and the cooler, respectively. The circulator is installed in the recess to circulate the flowing of the cooling liquid. As such, heat generated from the heat source is directly conducted to the housing and takes away by the cooling liquid circulated by the circulator to the cooler.

The passage can be formed by a plurality of apertures, protruded columns or vortex slots on the bottom of the recess to increase heat exchanging area. The circulator includes rotator component, a retainer component and a stator component. The rotator component includes a magnetic pole and an impeller, and the stator component includes a circuit board, a coil and a core. The impeller is located right above the passage so that during the rotation of the impeller, the water flowing rate can be increased to enhance the heat exchanging efficiency.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF ACCOMPANIED DRAWINGS

The above objects and advantages of the present invention will be become more apparent by describing in detail exemplary embodiments thereof with reference to the attached drawings in which.

DETAILED DESCRIPTION OF EMBODIMENT

Figure 1:
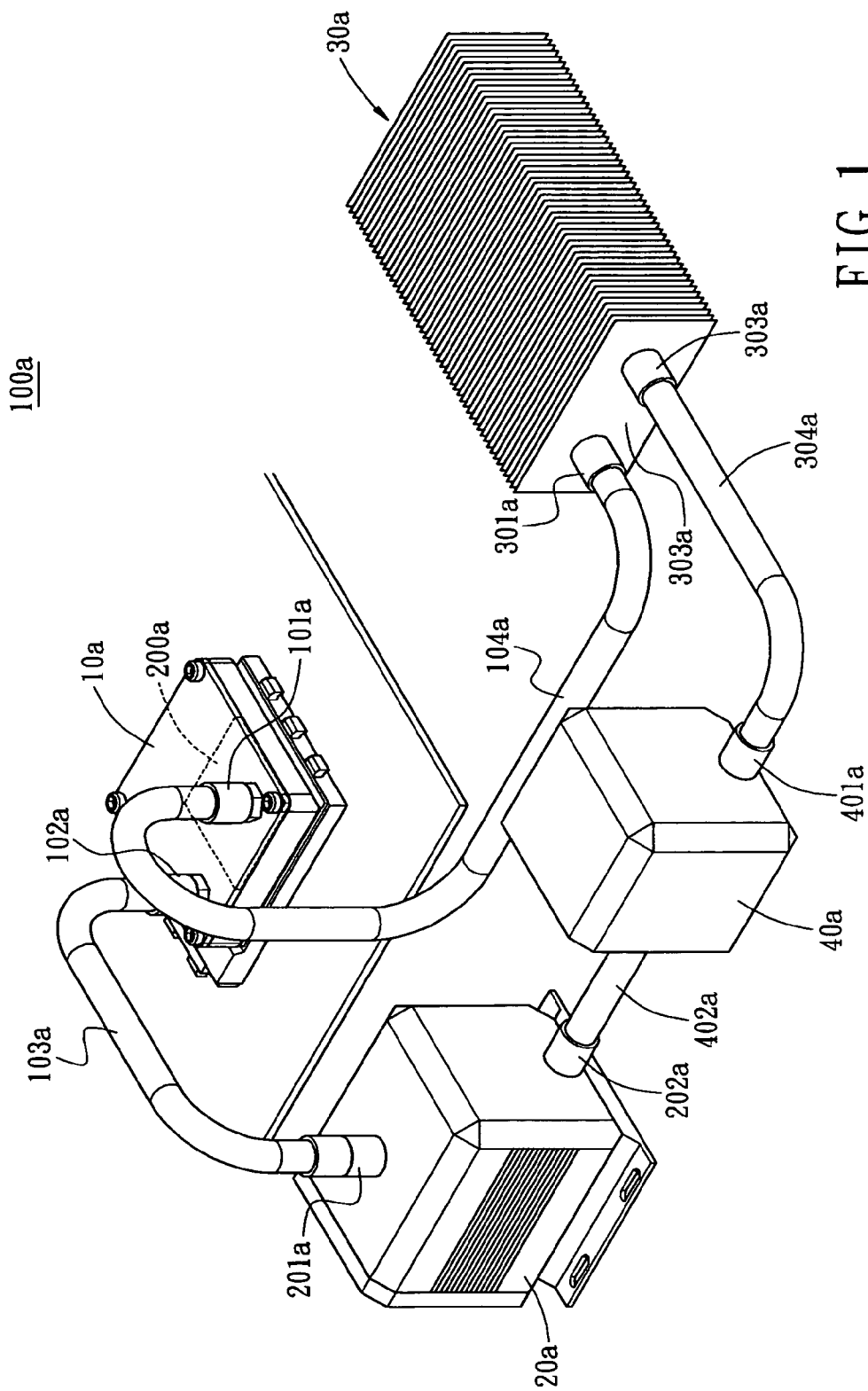
FIG. 1 shows a perspective view of a conventional water-cooling heat dissipation system.

Reference will now be made in detail to the preferred embodiments of the present invention, examples of which are illustrated in the accompanying drawings. Wherever possible, the same reference numbers are used in the drawings and the description to refer to the same or like parts.

Figure 2:
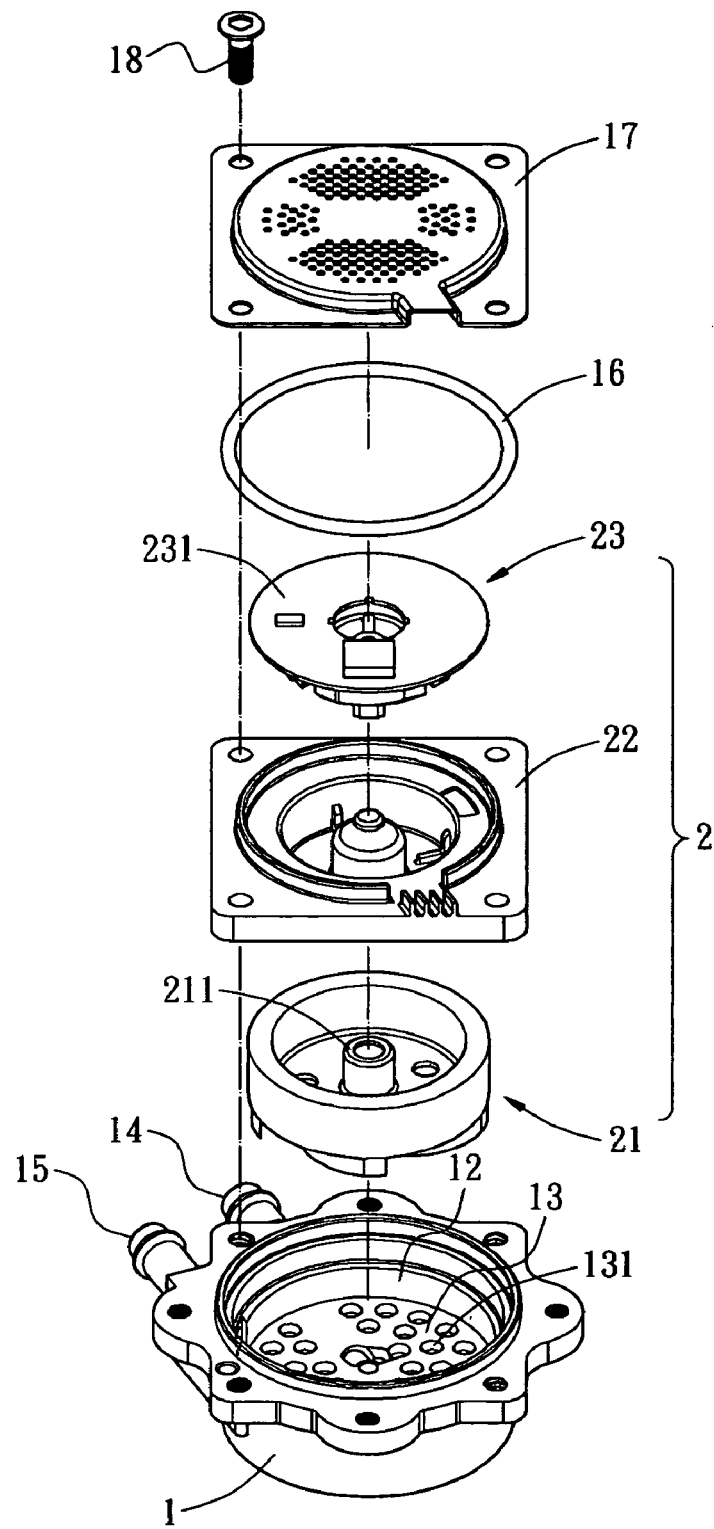
FIG. 2 shows an exploded perspective view of a water-cooling heat dissipation device according to the present invention.
Figure 3:
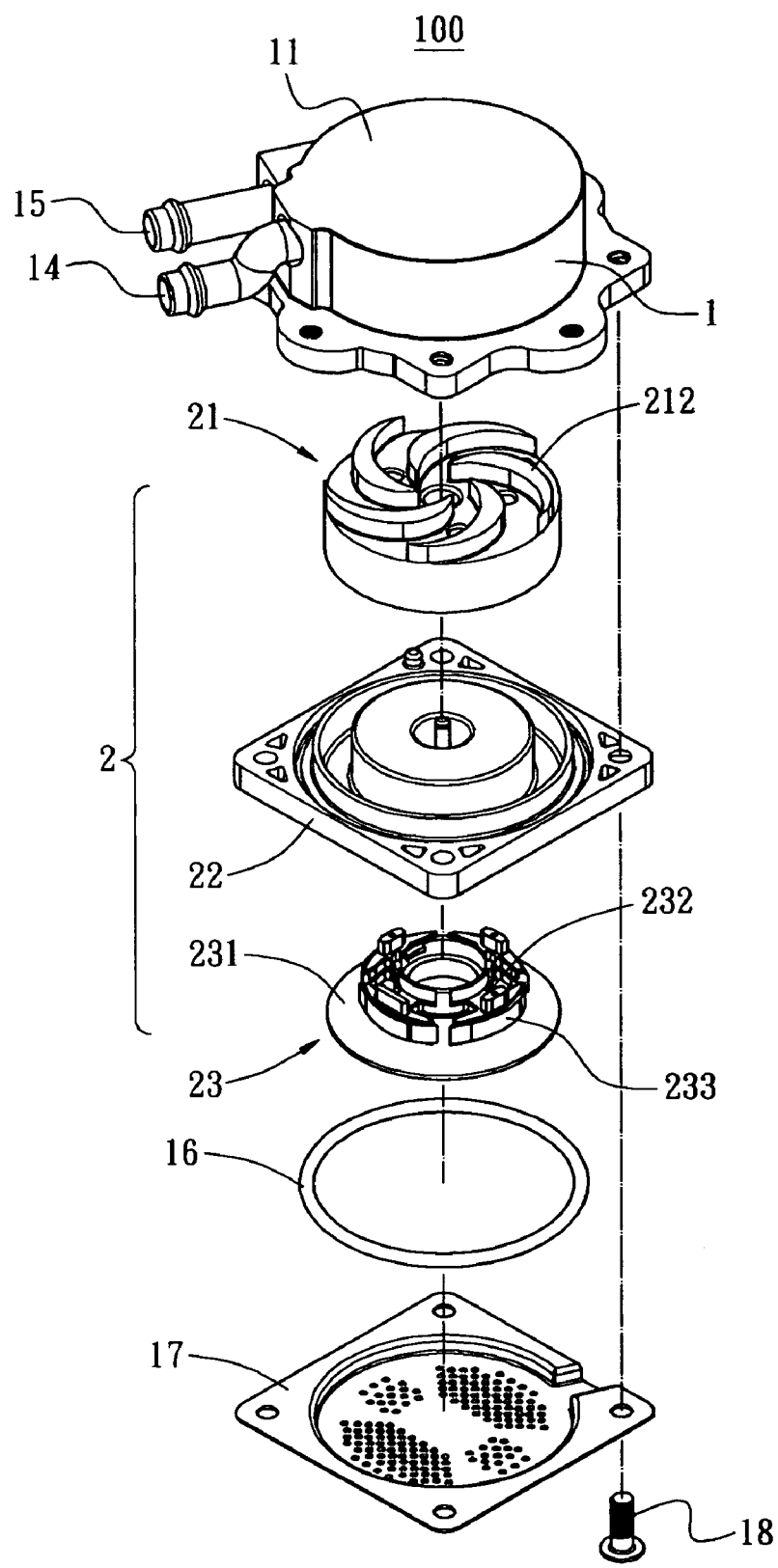
FIG. 3 shows another exploded perspective view of the water-cooling heat dissipation device.
Figure 7:
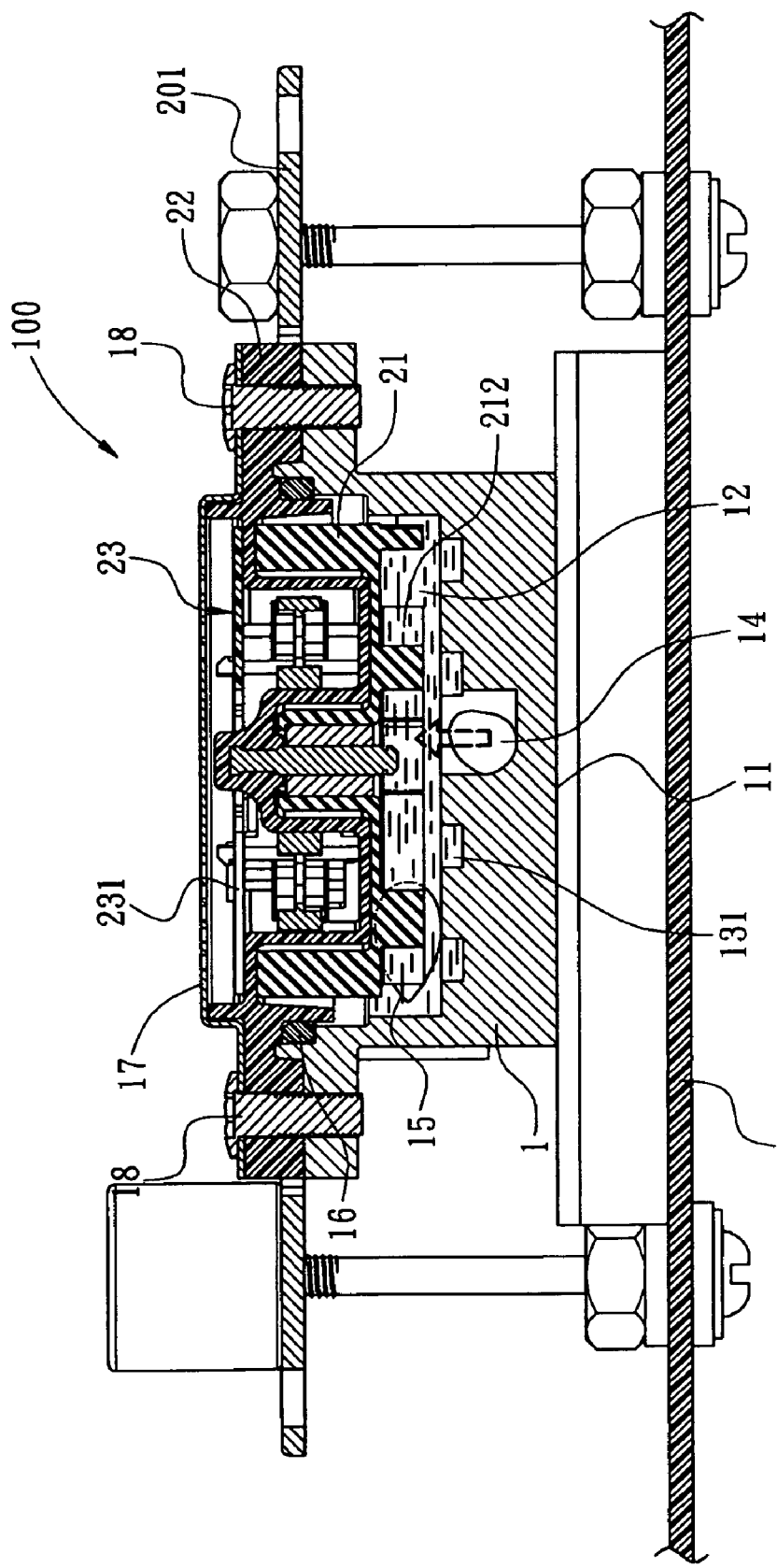
FIG. 7 shows a cross sectional view of the water-cooling heat dissipation device mounted on a CPU.

Referring to FIGS. 2 and 3, a water-cooling heat dissipation device 100 of the present invention can be used for a CPU, such as shown in FIG. 7. The water-cooling heat dissipation device 100 includes a housing 1 and a water circulator 2. A bottom surface 11 of the housing 1 for contact with the CPU 200 is made of heat conductive material such as copper or aluminum. Or, the whole housing 1 can be made of heat conductive material such as metal.

The housing 1 includes a recess 12. In this preferred embodiment, a plurality of apertures 131 are formed on the bottom of the recess 12 as a water passage 13. The water circulator 2 includes a rotor component 21, a retainer component 22 and a stator component 23. The rotor component 21 includes a magnetic pole 211 and an impeller 212. The stator component 23 includes a circuit board 231, a coil 232 and a core 233. When the water circulator 2 is installed in the recess 12, the impeller 212 is located right above the water passage 13.

Furthermore, the housing 1 includes a water inlet 14 and water outlet 15 both connected to the recess 12. A sealing O-ring 16 and a lid 17 cover on the top of the housing 1 to fit the water circulator 2 inside the housing 1.

Figure 4:
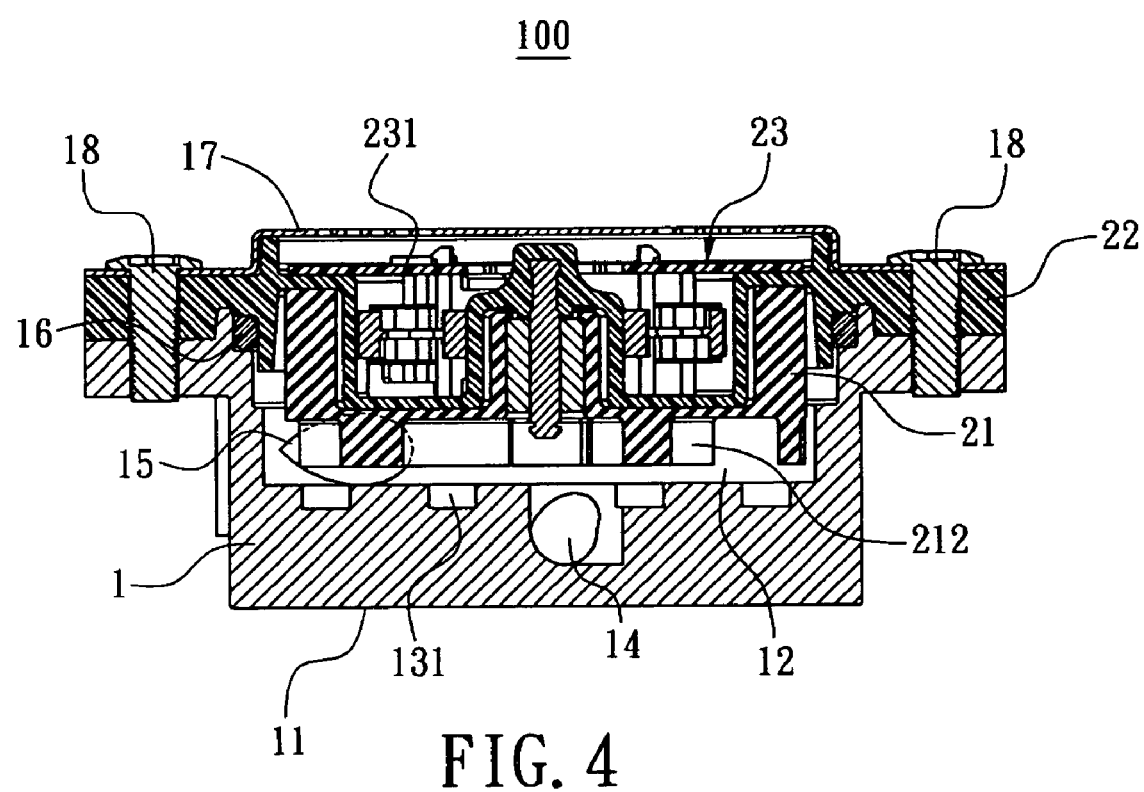
FIG. 4 shows a cross sectional view of the water-cooling heat dissipation device.

As shown in FIG. 4, firstly the rotor component 21 and the stator component 23 are respectively disposed on the retainer component 22 to combine as the water circulator 2. The water circulator 2 is then installed in the recess 12 to have the impeller 212 located corresponding to the water passage 13. After the O-ring 16 and the lid 17 are put on the top of the housing 1 and a fastening element 18 is used to secure the lid 17 with the housing 1, the assembly of the water-cooling heat dissipation device 100 of the present invention is completed.

Figure 5:
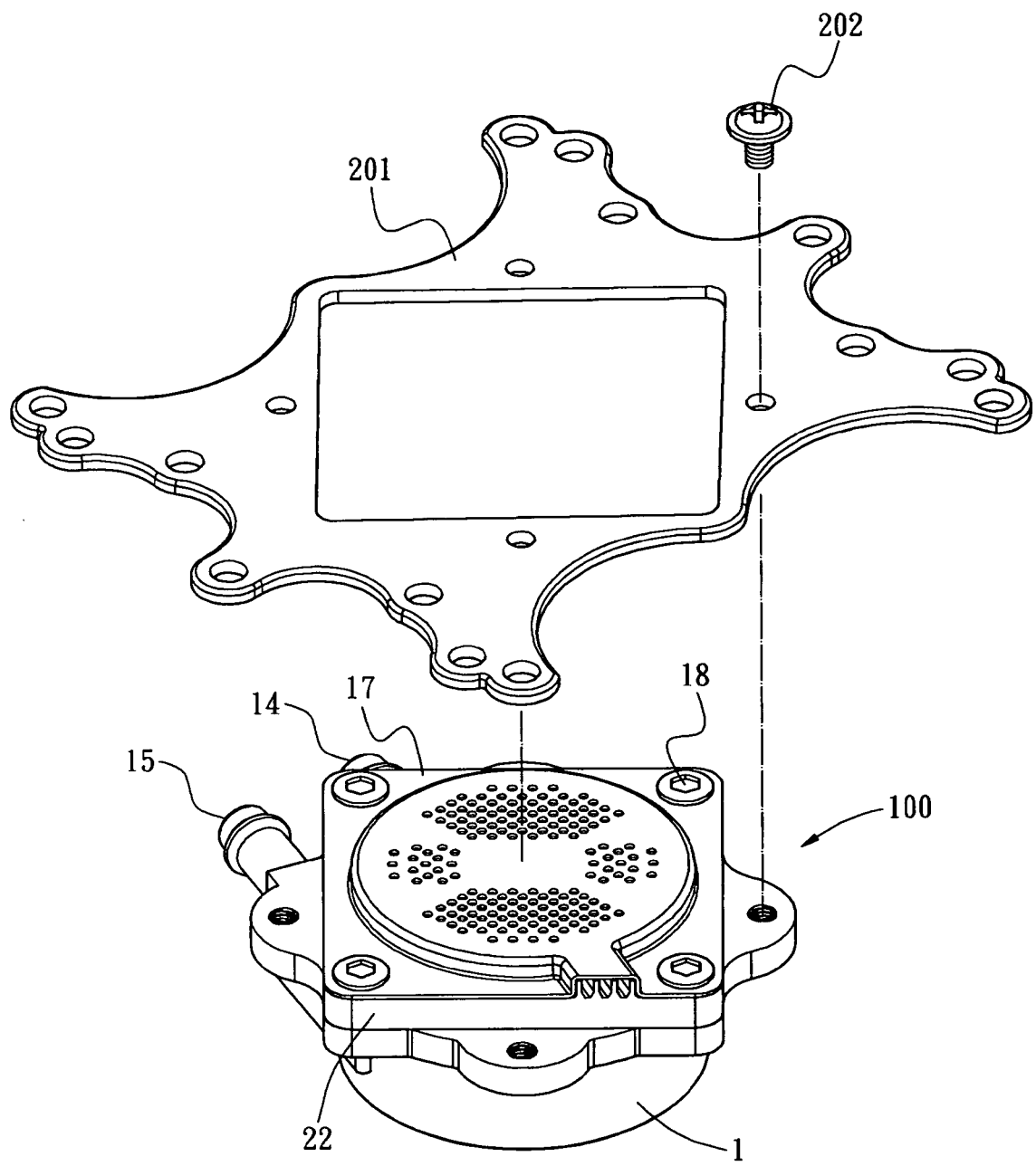
FIG. 5 shows an assembly of the water-cooling heat dissipation device and a mounting plate.
Figure 6:
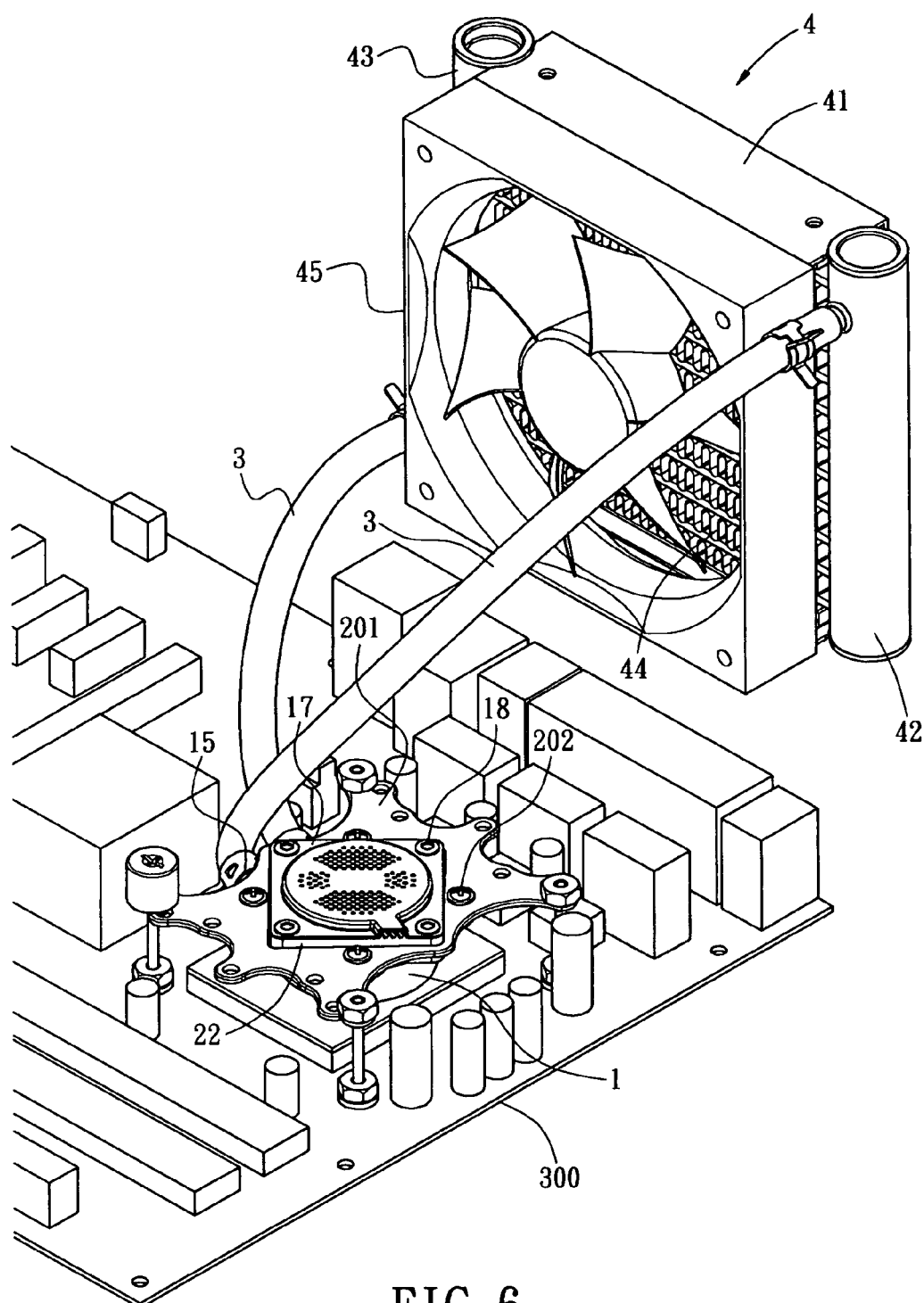
FIG. 6 shows the water-cooling heat dissipation device of the present invention mounted in a computer associated with a cooling device.

Referring to FIG. 5, in order to install the water-cooling heat dissipation device 100 of the present invention on the CPU 200, a mounting plate 201 is provided to fix on the water-cooling heat dissipation device 100 by a bolt 202. As such, when the mounting plate 201 is secured on a motherboard 300 of a computer, as shown in FIG. 6, the bottom surface 11 of the housing 1 can contact with the CPU 200. Moreover, two pipes 3 are provided to connect the water inlet 14 and the water outlet 15, respectively. The other ends of two pipes 3 are connected to a cooler 4. The cooler 4 includes a main body 41, a water inlet tube 42 and a water outlet tube 43. One pipe 3 is connected between the water inlet 14 and the water outlet tube 43. The other pipe 3 is connected between the water outlet 15 and the water inlet tube 42. The main body 41 includes a plurality of stacked fins 44. Therefore, the warmer water flows into the water inlet tube 42 can be cooled down via the heat exchange of the fins 44 to provide cooler water flowing out from the water outlet tube 42 to the water-cooling heat dissipation device 100. In addition, a fan 45 can be mounted to the main body 41 at the side of the stacked fins 44 to speed heat exchange of the fins 44.

As shown in FIG. 7, heat generated from the CPU 200 is conducted to the water-cooling heat dissipation device 100 via the housing 1. The cooler water input from the water outlet tube 42 flows into the water inlet 14 through the pipe 3 and further flows into the recess 12 through the water passage 13. Such that, the cooler water is heated by the CPU 200 to take away the heat of the CPU 200. The heated water then flows out of the water-cooling heat dissipation device 100 from the water outlet 15 to the water inlet tube 42 through the pipe 3. The warmer water heated by the CPU 200 can be cooled down through the stacked fins 44 to supply cooler water again for the water-cooling heat dissipation device 100.

Figure 8:
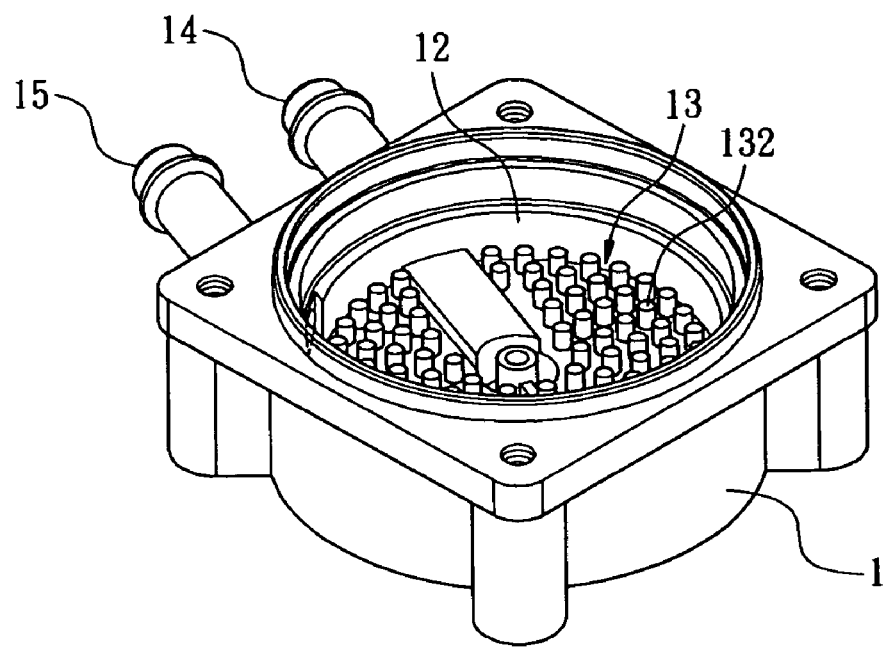
FIG. 8 shows another preferred embodiment of the water-cooling heat dissipation device according to the present invention.
Figure 9:
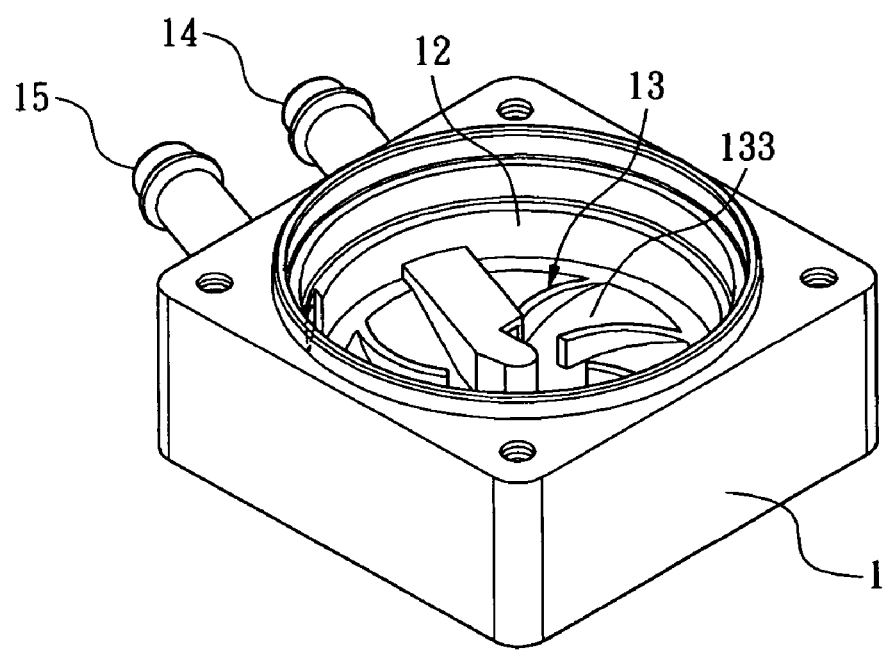
FIG. 9 shows still another preferred embodiment of the water-cooling heat dissipation device according to the present invention.

Referring to FIG. 8, in another preferred embodiment, the water passage 13 formed in the recess 12 includes a plurality of protruded columns 132. Or, as shown in FIG. 9, the water passage 13 includes a plurality of vortex slots 133.

In the present invention, the water-cooling heat dissipation device 100 utilizes the housing 1 directly attached to the CPU 200 to conduct heat. The water circulator 2 can be fully contained inside the housing 1. The compact structure of the water-cooling heat dissipation device 100 reduces cost, weight and volume to provide functions of water storage, water circulation and heat exchange all together. Meanwhile, because the location of the impeller 212 is right above the water passage 13, during the rotation of the impeller 212, the water flowing rate can be increased to enhance the heat exchanging efficiency.

While the present invention has been particularly shown and described with reference to preferred embodiments thereof, it will be understood by those of ordinary skill in the art the various changes in form and details may be made therein without departing from the spirit and scope of the present invention as defined by the appended claims.

What is claimed is:

1. A heat dissipation system for conducting and dissipating heat generated by a heat source, comprising:
   a housing with at least one surface made of heat-conductive metal contacted with the heat source, including a recess with a passage formed on the bottom to contain cooling liquid and an inlet and an outlet connected to the recess; and
   a circulator installed in the recess to circulate the flowing of the cooling liquid;
   a lid covered on the top of the housing and a sealing ring disposed between the lid and the sealing ring to fit the circulator inside the housing;
   a cooler having a main body formed by a plurality stacked fins, an inlet tube and an outlet tube, two pipes respectively connected between the inlet and the outlet tube, and the outlet and the inlet tube so that under operation of the circulator, warmer cooling liquid in the housing flowing into the inlet tube through the outlet is cooled down via heat exchange of the fins to provide cooler cooling liquid flowing out from the outlet tube to the housing through the inlet.

2. The system as claimed in claim 1, wherein the housing has a bottom surface contacted with the heat source.

3. The system as claimed in claim 1, wherein the surface is made of copper or aluminum.

4. The system as claimed in claim 1, wherein the passage includes a plurality of apertures.

5. The system as claimed in claim 1, wherein the passage includes a plurality of protruded columns.

6. The system as claimed in claim 1, wherein the passage includes a plurality of vortex slots.

7. The system as claimed in claim 1, wherein the circulator includes a rotator component, a retainer component and a stator component.

8. The system as claimed in claim 7, wherein the rotator component includes a magnetic pole and an impeller, and the stator component includes a circuit board, a coil and a core.

9. The system as claimed in claim 8, wherein the impeller is located right above the passage.

10. The system as claimed in claim 1, further comprising a fan mounted to the main body at the side of the stacked fins.

* * * * *